(12) United States Patent
Ware et al.

(10) Patent No.: US 8,208,593 B2
(45) Date of Patent: Jun. 26, 2012

(54) PARTIAL-RATE TRANSFER MODE FOR FIXED-CLOCK-RATE INTERFACE

(75) Inventors: Frederick A. Ware, Los Altos Hills, CA (US); Robert E. Palmer, Carrboro, NC (US); John Poulton, Chapel Hill, NC (US)

(73) Assignee: Rambus Inc., Sunnyvale, CA (US)

( * ) Notice: Subject to any disclaimer, the term of this patent is extended or adjusted under 35 U.S.C. 154(b) by 873 days.

(21) Appl. No.: 12/247,871

(22) Filed: Oct. 8, 2008

(65) Prior Publication Data

US 2009/0129505 A1  May 21, 2009

Related U.S. Application Data

(60) Provisional application No. 60/989,067, filed on Nov. 19, 2007.

(51) Int. Cl.
*H04L 7/00* (2006.01)
(52) U.S. Cl. ........................................ 375/354
(58) Field of Classification Search .................. 375/257, 375/260, 316, 340, 354, 356
See application file for complete search history.

(56) References Cited

U.S. PATENT DOCUMENTS

| | | | |
|---|---|---|---|
| 6,542,976 B2 | 4/2003 | Barth et al. | |
| 6,701,446 B2 | 3/2004 | Tsern et al. | |
| 6,977,967 B1 * | 12/2005 | Tiedemann et al. | 375/297 |
| 7,042,914 B2 | 5/2006 | Zerbe et al. | |
| 7,190,754 B1 | 3/2007 | Chang et al. | |
| 7,542,532 B2 * | 6/2009 | Yamaguchi | 375/354 |
| 7,571,340 B2 * | 8/2009 | Jiang | 713/500 |
| 7,890,684 B2 * | 2/2011 | Berenbaum et al. | 710/110 |
| 2005/0114820 A1 | 5/2005 | Restle | |

FOREIGN PATENT DOCUMENTS

| | | |
|---|---|---|
| EP | 0967724 A2 | 12/1999 |
| EP | 0967724 A3 | 10/2003 |

OTHER PUBLICATIONS

Crisp, Richard, "Direct Rambus Technology: The New Main Memory Standard", Rambus inc., pp. 18-28, XP-000726001, IEEE Micro., Nov./Dec. 1997.
Luman, Heather et al., "Inductance Enhancement in Global Clock Distribution Networks", pp. 119-121, School of Electrical and Computer Engineering, Georgia Institute of Technology., 2004 IEEE.

* cited by examiner

*Primary Examiner* — Khanh C Tran
(74) *Attorney, Agent, or Firm* — Park, Vaughan, Fleming & Dowler LLP

(57) ABSTRACT

Systems and methods are provided for a partial-rate transfer mode using fixed-clock-rate interfaces. In the partial-rate mode, each data bit is transmitted consecutively two or more times. The receiver uses a global clock without phase adjustment to detect the replicated incoming bits. As a result, the receiver system can receive data at a partial data rate when the system is locking into the phase of data received from the transmitter.

22 Claims, 7 Drawing Sheets

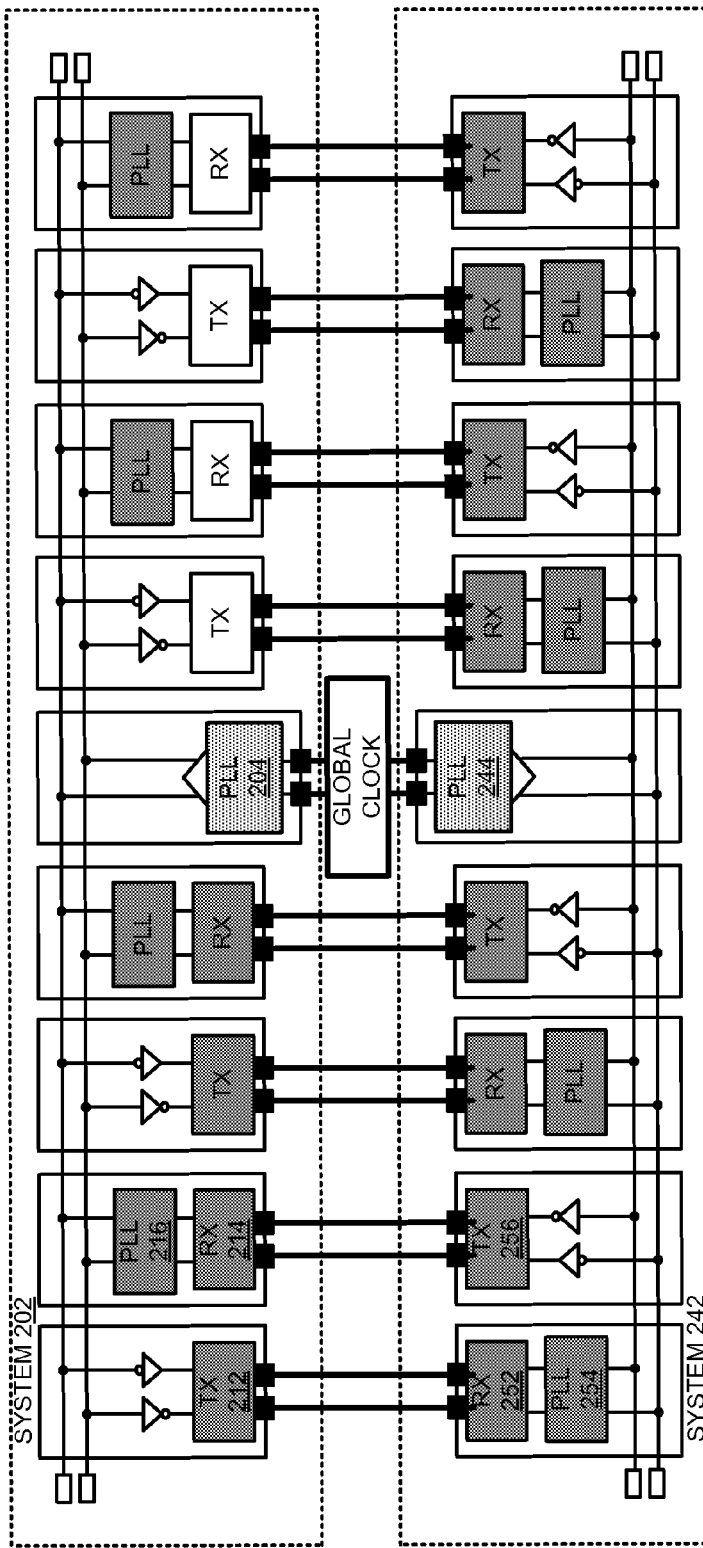
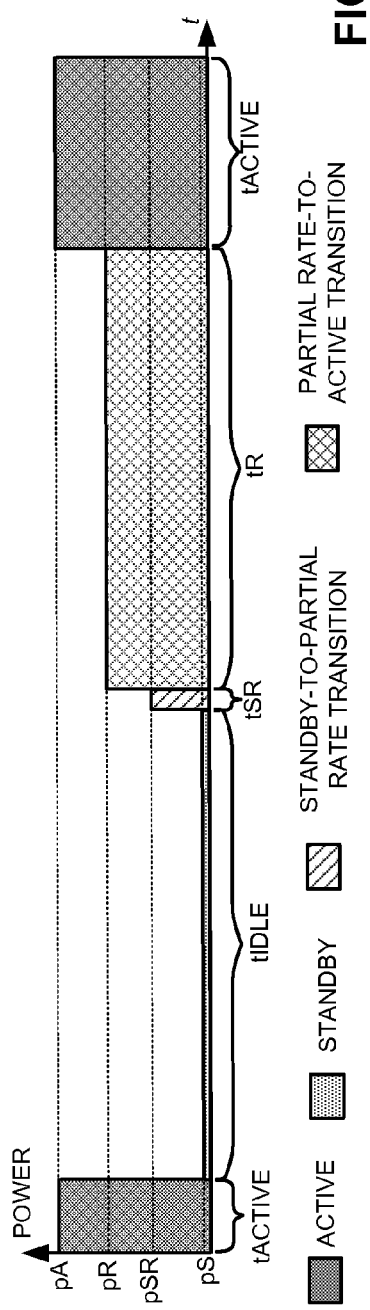
FIG. 2

TRANSMITTED DATA (SERIAL) 0000001111000000
rxdat[15:0] (PARALLEL) 0000000000011110
rxshift[15:0] (PARALLEL) 0000001111000000
FIG. 6
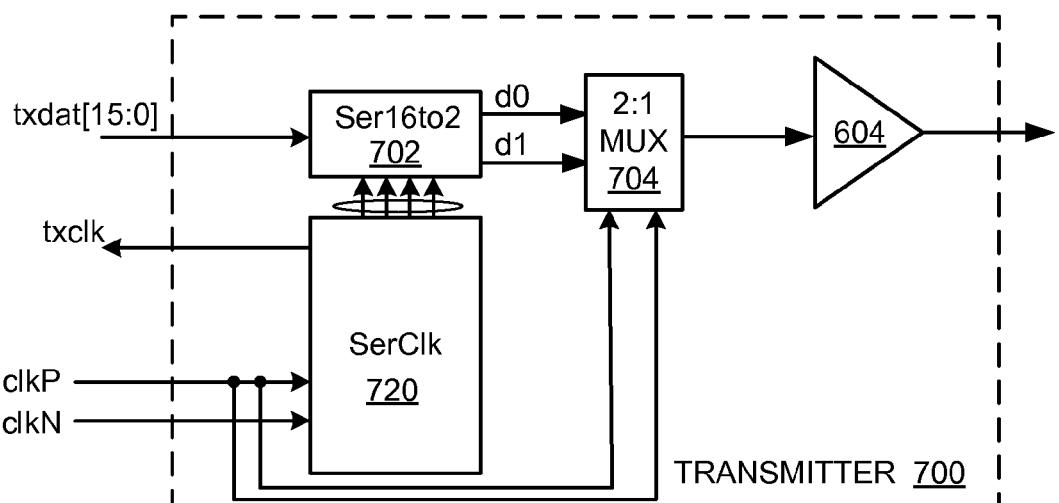
FIG. 7
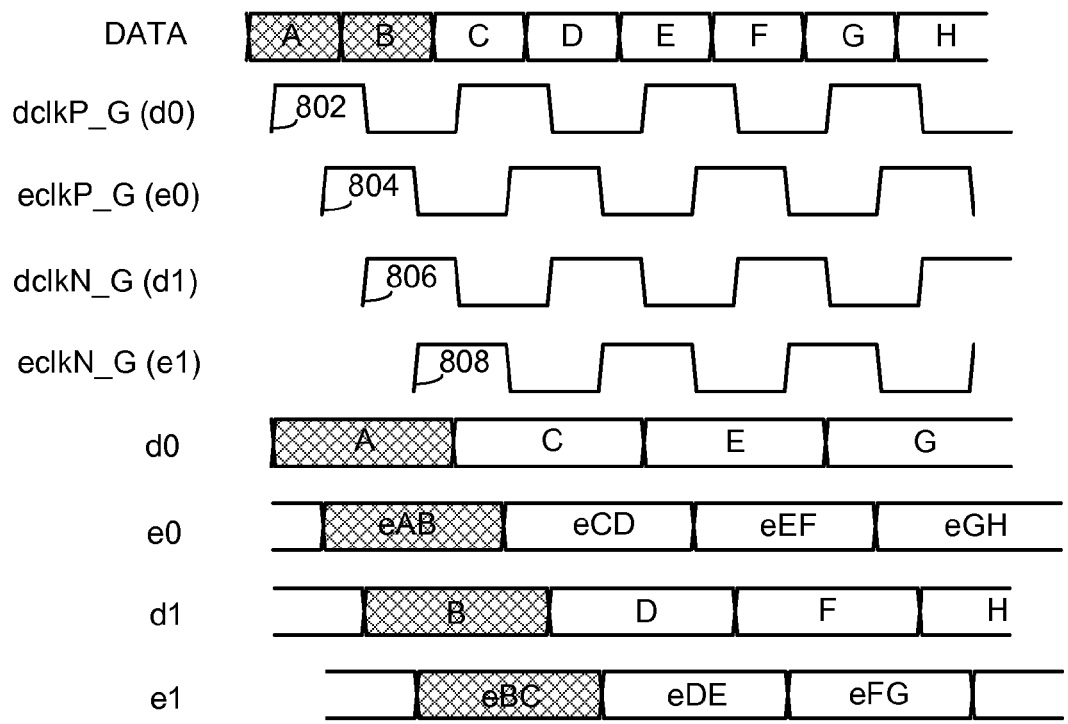
FIG. 8

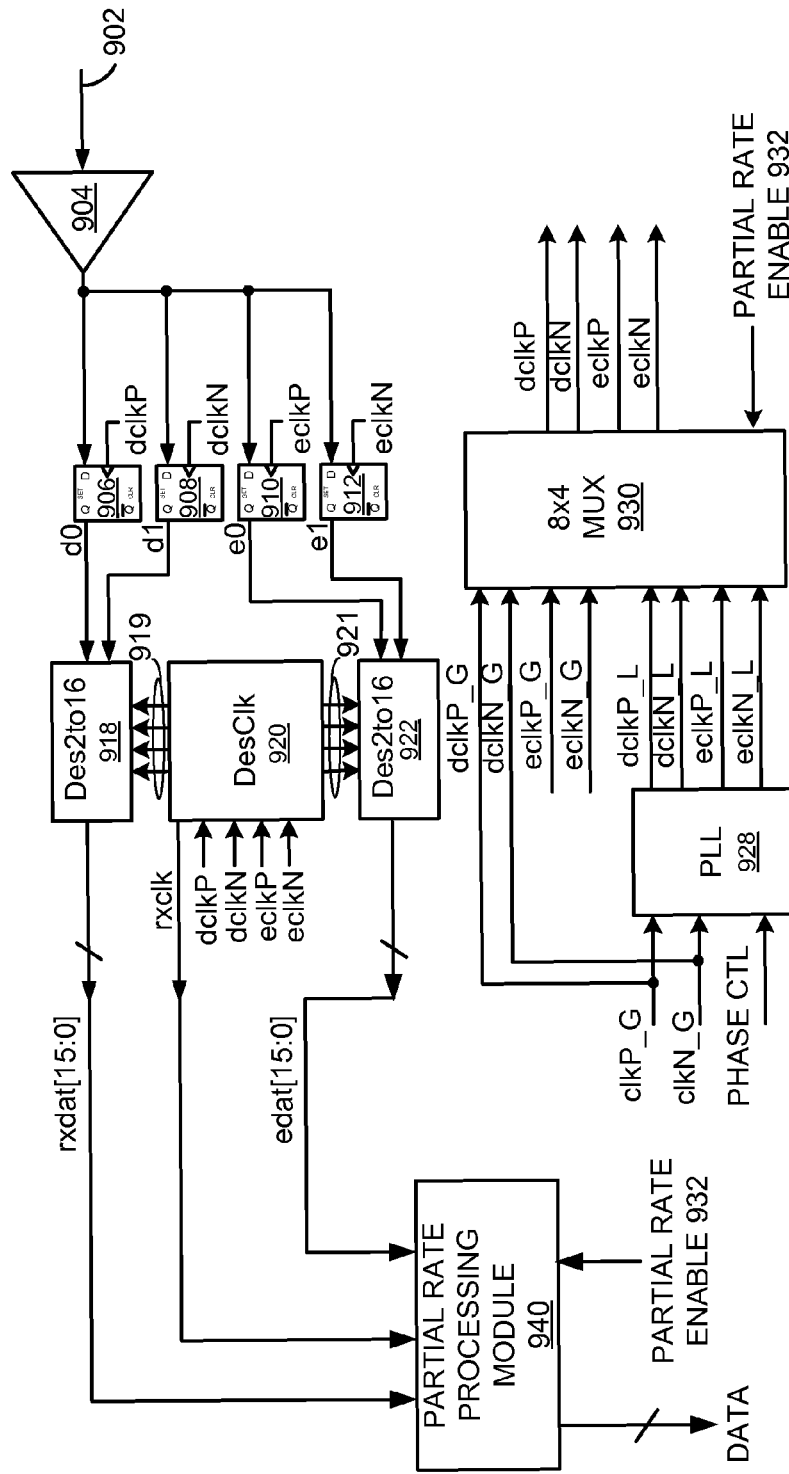

PARTIAL-RATE TRANSFER MODE FOR FIXED-CLOCK-RATE INTERFACE

RELATED APPLICATIONS

This application hereby claims priority under 35 U.S.C. § 119 to U.S. Provisional Patent Application No. 60/989,067, filed on 19 Nov. 2007, entitled "PARTIAL-RATE TRANSFER MODE FOR FIXED-CLOCK-RATE INTERFACE", by inventors Frederick A. Ware et al. The present application hereby incorporates by reference the above-referenced provisional patent application.

BACKGROUND

This disclosure generally relates to transmitter and receiver systems. In particular, this disclosure relates to systems that facilitate a partial-rate data transfer mode using fixed-clock-rate interfaces.

Present computing and communication systems require progressively higher off-chip communications bandwidth, and multi-Gb/s serial links for chip-to-chip interconnects are becoming ubiquitous. Meanwhile, power consumption is becoming an increasingly important design metric, especially for mobile applications. System designers often face the challenge of providing high bandwidth, low power consumption, and minimal latency at the same time.

BRIEF DESCRIPTION OF THE FIGURES

FIG. 2 illustrates a number of transmitter-receiver pairs configured to operate in standby, partial-rate, and active modes and an exemplary power-consumption vs. time diagram for different modes in accordance with one embodiment of the present invention.

FIG. 6 illustrates an exemplary calibration process in a quarter-rate transfer mode in accordance with an embodiment of the present invention.

FIG. 7 presents an exemplary block diagram for a transmitter capable of operating in a partial-rate transfer mode in accordance with one embodiment of the present invention.

FIG. 8 presents an exemplary timing diagram of a data signal and a set of quadrature global clock signals used in a half-rate transfer mode in accordance with one embodiment of the present invention.

FIG. 9 presents an exemplary block diagram of a receiver capable of operating in a half-rate transfer mode in accordance with one embodiment of the present invention.

FIG. 10 illustrates an exemplary calibration process in a half-rate transfer mode in accordance with one embodiment of the present invention.

Figure 1:
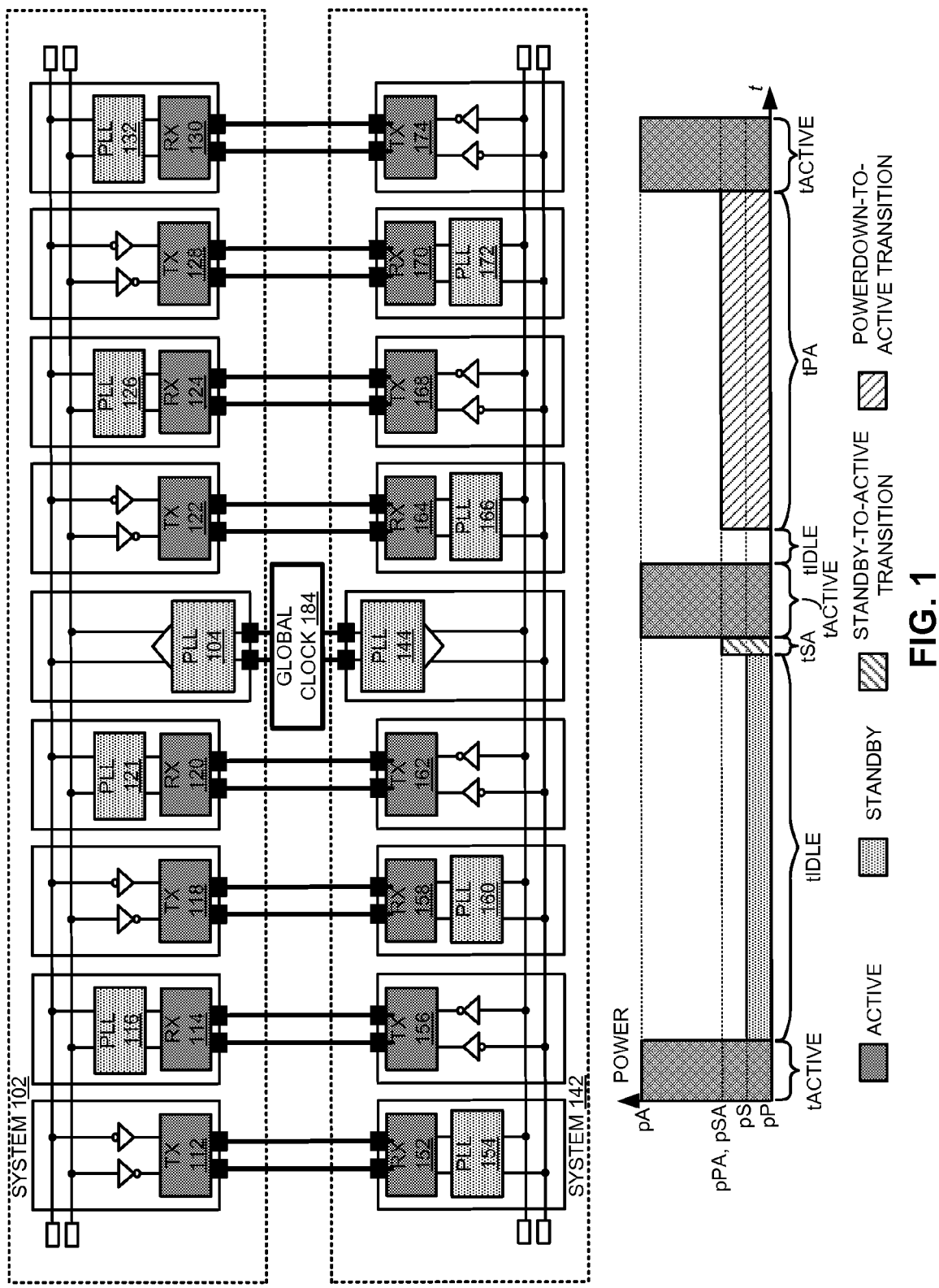
FIG. 1 illustrates a number of transmitter-receiver pairs capable of operating in a partial-rate mode but configured to operate in conventional power-down, standby, and active modes, and an exemplary power-consumption vs. time diagram for different modes in accordance with one embodiment of the present invention.

TABLE 1 presents a set of exemplary power-consumption values and the amount of time for transitions between different modes in a 6.25 Gb/s system which can operate in a partial-rate transfer mode but configured to operate in conventional modes, in accordance with one embodiment of the present invention.

TABLE 2 presents a set of exemplary power-consumption values and the amount of time for transitions between modes in a 6.25 Gb/s system configured to operate in a partial-rate transfer mode in accordance with one embodiment of the present invention.

In the drawings, the same reference numbers identify identical or substantially similar elements or acts. The most significant digit or digits in a reference number refer to the figure number in which that element is first introduced. For example, element 102 is first introduced in and discussed in conjunction with FIG. 1.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Overview

Embodiments of the present invention provide a novel system that facilitates a partial-rate transfer mode for fixed-clock-rate transmission/receiving interfaces. In one embodiment, the transmitter-receiver pair operates in three modes: a standby mode, a partial-rate mode, and an active mode. During the standby mode, most of the receiver circuitry is turned off. A global clock signal is continuously delivered to the receiver, and a global phase-locking mechanism on the receiver remains operative to provide a clock signal with a deterministic phase.

In the partial-rate mode, the receiver activates its local phase-adjusting circuitry to generate the sampling signals that are to be used for sampling data during the active mode. Meanwhile, the transmitter can emulate a partial-rate transmission by transmitting each data bit two or more times at full data rate. As a result, the receiver can use the global clock signal without any phase adjustment to receive the data. Note that this partial-rate data transfer can be performed with the normal clock rate. Hence, embodiments of the present invention can benefit systems with a fixed clock rate. This partial-rate transfer mode allows data transfer during the transition from the standby mode to the active mode. Consequently, the system can reduce data-transfer latency and increase the effective bandwidth.

Multi-Mode Operation without Partial-Rate Data Transfer

FIG. 1 illustrates a transmitter-receiver pair capable of operating in a partial-rate transfer mode but configured to operate in conventional power-down, standby, and active modes and an exemplary power-consumption vs. time diagram for different modes, in accordance with one embodiment of the present invention. (Note that, in some embodiments, a transmitter or receiver system is capable of operating in the novel partial-rate transfer mode as well as the conventional power-saving modes.) System 102 includes four transmitters 112, 118, 122, and 128, and four receivers 114, 120, 124, and 130. System 102 also includes a global phase-locking mechanism 104, which is coupled to a global clock distribution mechanism 184 and produces a local clock signal for the transmitters and receivers in system 102. Also included in system 102 are four local phase-adjusting mechanisms 116, 121, 126, and 132, which are coupled to receivers 114, 120, 124, and 130, respectively. Note that global clock distribution mechanism 184 can be a stand-alone mechanism outside of system 102 or 142, or can be included in one of the systems. For example, system 102 can be a memory controller which includes a global clock generation or distribution mechanism, and system 142 can be a memory module.

Similarly, system 142 includes four transmitters 156, 162, 168, and 174, and four receivers 152, 158, 164, and 170. System 142 also includes a global phase-locking mechanism 144, which is coupled to global clock distribution mechanism 184 and produces a local clock signal for the transmitters and receivers in system 142. Also included in system 142 are four local phase adjusting mechanisms 154, 160, 166, and 172, which are coupled to receivers 152, 158, 164, and 170, respectively.

Transmitters 112, 118, 122, and 128 are coupled to receivers 152, 158, 164, and 170, respectively. Similarly, transmitters 156, 162, 168, and 174 are coupled to receivers 114, 120, 124, and 130, respectively. Global phase-locking mechanisms 104 and 144 lock into the frequency of the global clock signal with a deterministic phase in their respective outputs. These output clock signals are then respectively distributed through out systems 102 and 142. Global phase-locking mechanisms 104 and 144 include phase-locking loops (PLLs). These PLLs lock into the frequency of the global clock signal. These PLLs provide only limited phase-adjusting capabilities with respect to their output signals. That is, the output of these PLLs only needs to be frequency-locked, but not phase-locked, to the global clock signal. Note that these PLLs still need to produce a signal with a substantially deterministic phase. In other words, the phase of the output of global phase-locking mechanism 104 or 144 does not vary quickly over time.

Since systems 102 and 142 are substantially similar, the following description, although directed to system 102, is also applicable to system 142. The output of global phase-locking mechanism 104 is a signal with the same frequency as the global clock signal and is distributed to the transmitters and receivers in system 102. Note that this global clock signal typically exhibits an arbitrary (but fixed) phase relative to the incoming data signals, and therefore cannot be directly used for data-receiving purposes. Hence, a respective receiver is equipped with a phase-adjusting mechanism to fine-tune the phase of the global clock signal, so that transitions of the phase-adjusted global clock signal (i.e., sampling edges) are aligned with desired sampling points in the incoming data signals, and thereby provide sufficient signal-detection margin. For example, receiver 114 is equipped with a phase-locking loop 116 to generate a phase-adjusted local clock signal having an arbitrary phase offset relative to the global clock signal, and thereby provide receiver 114 with a phase-adjusted local clock signal having sampling edges in a desired alignment with the incoming data signal. For instance, the data-sampling edge used by receiver 114 may fall approximately in the center of a data eye (i.e., interval over which data is valid and may be sampled), which gives receiver 114 sufficient margin for data detection.

Phase-locking mechanism 104 differs from PLL 116 and other receiver-specific PLLs in that phase-locking mechanism 104 does not provide arbitrary phase-adjustment capability with respect to its output signal. As a result, PLL 104 is typically less complex and consumes less power. Phase-locking mechanism 104 performs only frequency-locking, but not phase-locking, to the global clock signal. In particular, phase-locking mechanism 104 does not need to provide a phase vector which is typically used to interpolate and adjust the phase of the output signal to a specific position relative to the global clock signal.

Although capable of operating in the novel partial-rate mode, in this example, systems 102 is configured to operate in three modes: power-down, standby, and active. In the power-down mode, at least some components of system 102, including phase-locking mechanism 104, are disabled or otherwise turned off (i.e., the supplied power is removed), so that little or negligible power is consumed.

In the standby mode, receivers 114, 120, 124, and 130, and transmitters 112, 118, 122, and 128 are turned off (i.e., the power to these components is removed). However, phase-locking mechanism 104 and phase-adjusting mechanisms 116, 121, 126, and 132 remain powered on, operational, and locked in, thus resulting in reduced, but non-negligible power consumption.

In the active mode, all the receivers 114, 120, 124, and 130, transmitters 112, 118, 122, and 128, phase-adjusting mechanisms 116, 121, 126, and 132, and the phase-locking mechanism 104 are powered on and operate at the full data rate.

TABLE 1 presents a set of exemplary power-consumption values and the amount of time for transitions between different modes in a 6.25 Gb/s system capable of operating in a partial-rate transfer mode but configured to operate in the conventional modes, in accordance with one embodiment of the present invention.

TABLE 1

| Symbol | Description | Value |
|---|---|---|
| pP | Power consumption during power-down mode | ~0 mW |
| pS | Power consumption during standby mode | ~20 mW |
| pA | Power consumption during active mode | ~110 mW |
| pPA | Power consumption during transition from power-down mode to active mode | ~40 mW |
| pSA | Power consumption during transition from standby mode to active mode | ~40 mW |
| tBIT | Active-mode bit time | ~160 ps |
| tPA | Transition time from power-down mode to active mode | ~500 ns, or 3000 tBIT |
| tSA | Transition time from standby mode to active mode | ~15 ns, or 100 tBIT |

As shown in TABLE 1, although the standby-to-active transition is relatively short, the standby power consumption is approximately one sixth of the active power consumption. Hence, if the system remains in the standby mode for too long, the standby power consumption can quickly offset the power savings. On the other hand, although the power-down mode consumes a negligible amount of power, the power-down-to-active transition takes a long time and can consume a significant amount of power. Since the system cannot transmit or receive data during the transition period, if the system switches between power-down and active modes frequently, the system would lose the power-saving benefits and suffer from increased data-transfer latency.

The problem described above is more clearly illustrated in the exemplary power-consumption vs. time diagram for different modes in FIG. 1. As illustrated in this example, the system enters the standby mode after the first active period. Since this standby period is significantly longer than the first active period, the total power consumption in the standby period actually surpasses the power consumed during the first active period.

After the second active period, the system enters the power-down mode. After being in the power-down mode for a short time, the system needs to enter the active mode for data transfer. However, the system cannot quickly switch to the active mode, because the receiver and phase-adjusting circuitry have been turned off in the power-down mode. Consequently, the system spends tPA amount of time in transition, when the phase-locking and phase-adjusting mechanisms prepare the proper clock signals, before it can commence data transfer.

As illustrated in the example in FIG. 1, if the system experiences many short bursts of data transfers followed by periods of inactivity, the system would be switching between different modes frequently. Over time, the power savings could only be marginal due to the higher power consumption in the standby mode and power-down-to-active transitions.

Partial-Rate Transfer Mode

In one embodiment, a receiver system, with collaboration from a transmitter system, is configured to operate in three modes: standby, partial-rate, and active. In the standby mode, at least some components of the receiver circuit, except for the global phase-locking mechanism, are turned off (i.e., with power removed). In the partial-rate mode, the local, receiver-specific phase-adjusting mechanisms are powered on to lock into the respective phase for optimal data reception at a respective receiver. Meanwhile, the receivers are also powered on to receive data by using the global clock signal provided by the global phase-locking mechanism without any phase adjustment. Each data bit is transmitted multiple times at the full data rate by the transmitter. In this way, the system can reliably receive the payload data at an effective partial data rate without using the local fine-tuned, phase-adjusted sampling edges. Furthermore, the partial-rate transfer mode does not require a slower clock speed, which allows systems with fixed-clock-rate interfaces to benefit from the power savings.

FIG. 2 illustrates a number of transmitter-receiver pairs configured to operate in standby, partial-rate, and active modes and an exemplary power-consumption vs. time diagram for different modes in accordance with one embodiment of the present invention. System 202 includes a global phase-locking mechanism 204, a number of transmitters such as transmitter 212, receivers such as receiver 214, and phase-adjusting mechanisms such as phase-adjusting mechanism 216. Similarly, system 242 includes a global phase-locking mechanism 244, a number of transmitters such as transmitter 256, receivers such as receiver 252, and phase-adjusting mechanisms such as phase-adjusting mechanism 254.

A respective transmitter in system 202 is coupled to a receiver in system 242, and a respective receiver in system 202 is also coupled to a transmitter in system 242. There are four bi-directional data transfer channels between systems 202 and 242. Although the description below is directed to system 202, the same description also applies to system 242.

In the standby mode, at least part of system 202 is turned off. However, global phase-locking mechanism 204 remains operational in the standby mode, so that the global clock signal remains locked in and distributed to the transmitters and receivers. In one embodiment, global phase-locking mechanism 204 is a phase-locking loop which is capable of locking to the global clock signal's frequency and producing a clock signal with a deterministic phase. In the following description, this phase-locked global signal is indicated by the suffix "_G." For example, (clkP_G, clkN_G) denotes a pair of complementary, phase-locked global clock signals. Furthermore, the phase-adjusted, receiver-specific clock signals are indicated by the suffix "_L." Note that the power consumed by PLL 204 is relatively low compared with the power consumption of phase-adjusting mechanism 216, which includes circuitry for arbitrary phase adjustments.

In the partial-rate mode, the phase-adjusting mechanisms in system 202 are turned on. Referring to phase-adjusting mechanism 216 for example, in the partial-rate mode, phase-adjusting mechanism 216 adjusts the phase of the locked global clock signal provided by PLL 204, and optimizes the sampling edges to be used during the active mode. Meanwhile, the receivers in system 202 are also turned on to receive data at a partial data rate using the global clock signal provided by PLL 204 without any phase adjustments. Note that the eight transmitter/receiver pairs in FIG. 2 are just for illustration purposes. In practice, different channels in a system can operate in partial-rate mode independently or jointly. For example, one transmitter-receiver pair can operate in the partial-rate mode while one or more other pairs are in standby and/or active modes.

During the partial-rate mode, the transmitter (for example transmitter 256) transmits each data bit multiple times. In other words, one data bit is extended to occupy multiple unit intervals. For example, one data bit can occupy 2, 3, 4, or other number of unit intervals. As a result, receiver 214 does not need fine-tuned sampling edges to reliably detect such data bits. Instead, receiver 214 can use the rising or falling edge of the global clock to sample the incoming data bits, since each data bit is extended over multiple unit intervals. Note that a unit interval refers to the minimum time interval between condition changes of a data transmission signal, and may correspond to half a clock cycle in a double-date-rate (DDR) configuration or one clock cycle in a single-data-rate (SDR) configuration. A unit interval may also correspond to other fractional values of a clock cycle in other data-rate schemes. Although the examples presented in this disclosure are based on DDR operation, embodiments of the present invention can also be applied to systems with an SDR configuration.

After local phase-adjusting mechanisms, such as PLL 216, have locked into a substantially optimal phase with respect to the incoming data, system 202 enters the active mode. In the active mode, the receivers and transmitters operate at the full data rate. The receivers detect incoming bits using the phase-adjusted local clock signals provided by the local, receiver-specific PLLs.

Note that in one embodiment, system 202 can be a memory module, and system 242 can be a memory controller.

TABLE 2 presents a set of exemplary power-consumption values and the amount of time for transitions between modes in a 6.25 Gb/s system configured to operate in a partial-rate transfer mode in accordance with on embodiment of the present invention.

TABLE 2

| Symbol | Description | Value |
| --- | --- | --- |
| pS | Power consumption during standby mode | ~2-4 mW |
| pR | Power consumption during partial-rate mode | ~60-80 mW |

TABLE 2-continued

| Symbol | Description | Value |
|---|---|---|
| pA | Power consumption during active mode | ~110 mW |
| pSR | Power consumption during transition from standby mode to partial-rate mode | ~40 mW |
| tBIT | Active-mode bit time | ~160 ps |
| tBITR | Partial-rate-mode bit time | ~320-640 ps |
| tRA | Transition time from partial-rate mode to active mode | ~500 ns, or 3000 tBIT |
| tSR | Transition time from standby mode to partial-rate mode | ~15 ns, or 100 tBIT |

As shown in TABLE 2, the power consumption in the standby mode is very low (about 2-4 mW), which means that the system can remain in the standby mode for a long time without consuming too much power. By contrast, the exemplary system shown in FIG. 1, while in standby mode, could consume 5-10 times the power (about 20 mW, see TABLE 1). In one embodiment, the system can perform data transfer at half or quarter rate while in the partial-rate mode. Further, because the global phase-locking mechanism is operational and remains locked-in, the system may commence data transfer quickly (e.g., after 15 ns) after the payload data is ready, which significantly reduces the data-transfer latency. Note that, because of the reduced effective data rate, the receiver circuits may still receive data even though the local, receiver-specific PLLs are not phase-locked relative to the data bits. That is, the reduced effective data rate allows the receivers to reliably sample the data bits within a substantially larger time window, which spans over two or more unit intervals, than during full data-rate operation. This enlarged time window extends sufficiently to accommodate the arbitrary phase of the global clock signal which is directly used to sample the data bits during the partial-rate mode.

The power-consumption vs. time diagram in FIG. 2 illustrates the power savings due to the partial-rate transfer mode. Assume that after the first idle period, the transmitter system has data to transfer to the receiver system. In response, the receiver system transitions from the standby mode to the partial-rate mode. The time for this transition is tSR, which is approximately 15 ns, equivalent to 100 active-mode bit times. After the receiver system enters partial-rate mode, the transmitter system can start transferring data at half or quarter the normal data rate by transmitting each bit twice or four times. While data is being received at a reduced effective data rate in the partial-rate mode, the local, receiver-specific phase-adjusting mechanisms in the receiver system adjust the phase of their respective clock signals in preparation for the full-rate data transfer in the active mode. That is, data is received during the transition from partial-rate mode to full-rate active mode. After these phase-adjusting mechanisms lock into their respective clock signals, the receiver system enters the full-rate active mode, and the transmitter system starts transmitting data bits at the full rate.

It should be noted that the ability to receive at least some data prior to entering full data-rate active mode can be extremely helpful in certain types of systems, even though data is transferred between transmitter and receiver at a reduced effective data rate during partial-rate mode. For example, in a memory system, the first transmission after awaking from a reduced-power mode (which in one embodiment is the standby mode) is the communication of a fairly brief read command (or read request) from the memory controller to one or more memory devices. Thereafter, the memory devices typically perform a relatively long-latency core access operation (e.g., 40-100 nanoseconds (nS) in a dynamic random access memory device (DRAM)). Hence, the ability to transfer the memory read request during partial-rate mode may substantially reduce the data access latency. That is, a substantial portion of the system wake-up time (i.e., time to transition from reduced-power mode to full-rate active mode) may overlap with the core access time, since the system wake-up and core-access may be performed in parallel (concurrently) instead of sequentially.

Comparing the power-consumption diagram in FIG. 2 with the one in FIG. 1, one can observe that the new standby mode replaces the previous power-down mode, and the partial-rate mode replaces the previous standby mode. The new standby mode's power consumption is just slightly higher than the near-zero power consumption in the previous power-down mode. The power consumption in the partial-rate mode is comparable to the power consumption incurred by the power-down-to-active transition in the system shown in FIG. 1. Furthermore, the system can now transfer data in the partial-rate mode, which effectively speeds up data transfer.

Figure 3:
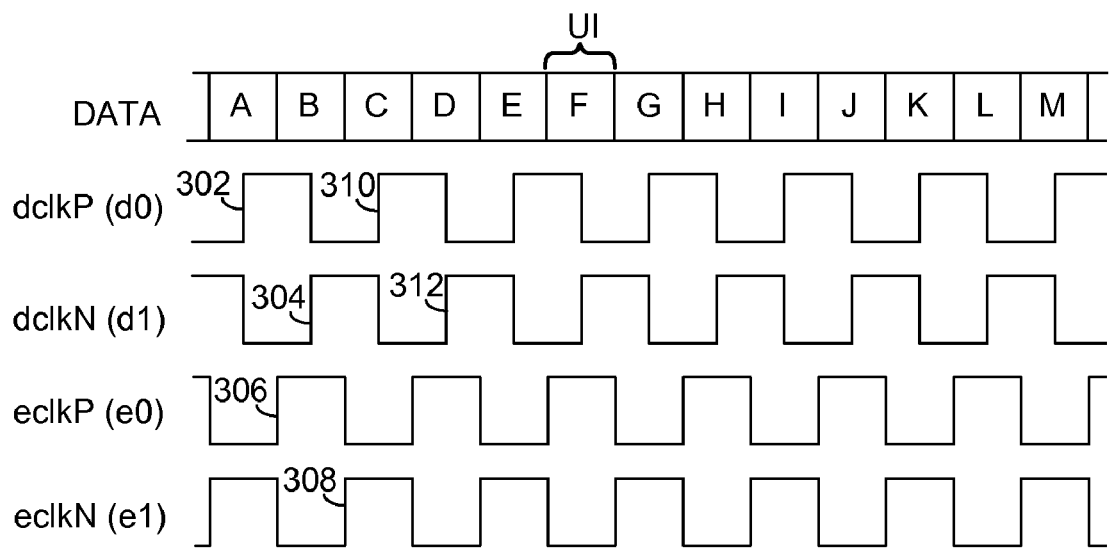
FIG. 3 presents an exemplary timing diagram of a data signal and a set of data and edge sampling signals used in a double-data-rate (DDR) configuration in accordance with one embodiment of the present invention.

FIG. 3 presents an exemplary timing diagram of a data signal and a set of data and edge sampling signals used in a double-data-rate (DDR) configuration in accordance with one embodiment of the present invention. In the active mode, two data bits are transferred in one clock cycle. Typically, the phase-adjusting mechanism at a receiver provides four sampling edges, a data clock signal (dclkP), an inversed data clock signal (dclkN), an edge clock signal (eclkP), and an inversed edge clock signal (eclkN). The phase-adjusting mechanisms continuously monitors the phase of these four clock signals, so their respective rising (or falling) edge is placed at the center of a data eye or at the transition edge between two data bits to provide reliable sampling. Note that, in all instances and embodiments herein, phase-adjusting mechanisms may be based on phase-locking loops or delay-locking loops. Other phase-adjusting mechanisms can also be used.

As illustrated in FIG. 3, during normal full-rate operation, each data bit occupies one unit interval, which is half of a clock cycle. The rising edges of dclkP and dclkN are placed in the middle of two consecutive data bits. For example, edges 302 and 304 sample data bits "A" and "B," respectively. Edges 310 and 312 sample data bits "C" and "D," respectively. As a result, data clock signals dclkP and dclkN can be used to sample two consecutive bits d0 and d1.

The associated edge clock signals, eclkP and eclkN, sample the transition edge between two consecutive data bits. The edge value or edge sample is used by the phase-adjusting mechanism in conjunction with the values of the data bits (i.e., the data samples) captured immediately before and after the edge to determine whether the edge clock signals and, correspondingly, the data clock signals, are early or late. For example, rising edge 306 is used to sample the transition edge between data bits "A" and "B," and rising edge 308 is used to sample the transition edge between data bits "C" and "D." If the value sampled by edge 306 (i.e., edge value) is the same as preceding data the value sampled by edge 302, but different from the succeeding data value (sampled by edge 304), the sampling clocks are deemed to be early. Conversely, if the edge value matches the succeeding data value but not the preceding data value, the clocks are deemed to be late. The phase-adjusting mechanism continuously monitors the edge and data values, and adjusts the phase of the four clock signals to ensure that the data sampling edges remain at the center of a data eye.

Quarter-Rate Transfer Mode

Figure 4:
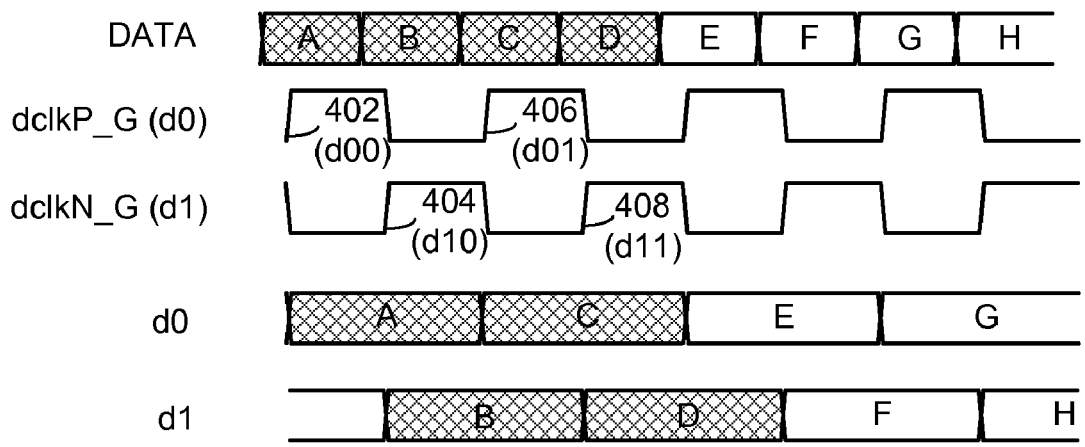
FIG. 4 presents an exemplary timing diagram of a data signal and a pair of global clock signals used in a quarter-rate transfer mode in accordance with one embodiment of the present invention.

In one embodiment, the transmitter system transmits each data bit consecutively four times during the partial-rate mode, thus effecting a quarter-rate transfer mode or quarter-rate mode. The effective data rate of the transfer is therefore a quarter of the normal rate. FIG. 4 presents an exemplary timing diagram of a data signal and a pair of global clock signals used in a quarter-rate transfer mode in accordance with one embodiment of the present invention.

As illustrated in FIG. 4, a data bit is transmitted consecutively four times, over four unit intervals. Hence, the transmitter can emulate a transmission at one-fourth the full data rate. In the following description, an "interval" refers to one unit interval. For example, intervals "ABCD" carry the value of one data bit, and intervals "EFGH" carry the value of another data bit.

On the receiver side, the receiver uses the phase-locked (but not necessarily phase-adjusted) global signal and its complement as the data sampling signals. For example, global clock signal dclkP_G provides rising edges 402 and 406, which are used to sample values at intervals "A" and "C." Similarly, inverted global clock signal dclkN_G provides rising edges 404 and 408, which are used to sample values at bit positions "B" and "D." Collectively, these four rising edges, denoted as d00, d01, d10, and d11, provide four consecutive samples during the time occupied by one data bit, which extends over four intervals. The values detected by these two clock signals are denoted as "d0" and "d1," as illustrated in FIG. 4. The value of d0 corresponds to the values of intervals A, C, E, G, and so forth. The value of d1 corresponds to the values of intervals B, D, F, H, and so forth.

In general, the receiver system samples four times a data bit which extends over four intervals, that is, twice with two consecutive rising edges of dclkP_G, and twice with two consecutive rising edges of dclkN_G. These four samples, when interleaved, provide four consecutive samples of a data bit. Note that the system does not need to adjust the phase of these sampling signals, since at least one sampling edge would fall substantially in the middle of a four-interval-long data bit. Typically, every data bit is sampled four times and the system can select the second or third sample as the main sampling point for a data bit. In the most extreme scenario, five or three sampling edges may fall within the same data bit due to signal drift or jitter. In such cases, the system can select the sampling edge in the middle (e.g., the second sampling edge if three sampling edges fall within one data bit, or the third sampling edge if five sampling edges fall within one data bit) as the main sampling point. This way, the system can ensure the best signal-detection margin both before and after that sampling point. Further details of the calibration process and how to select the sampling edge are provided in the description in conjunction with FIG. 6.

Figure 5:
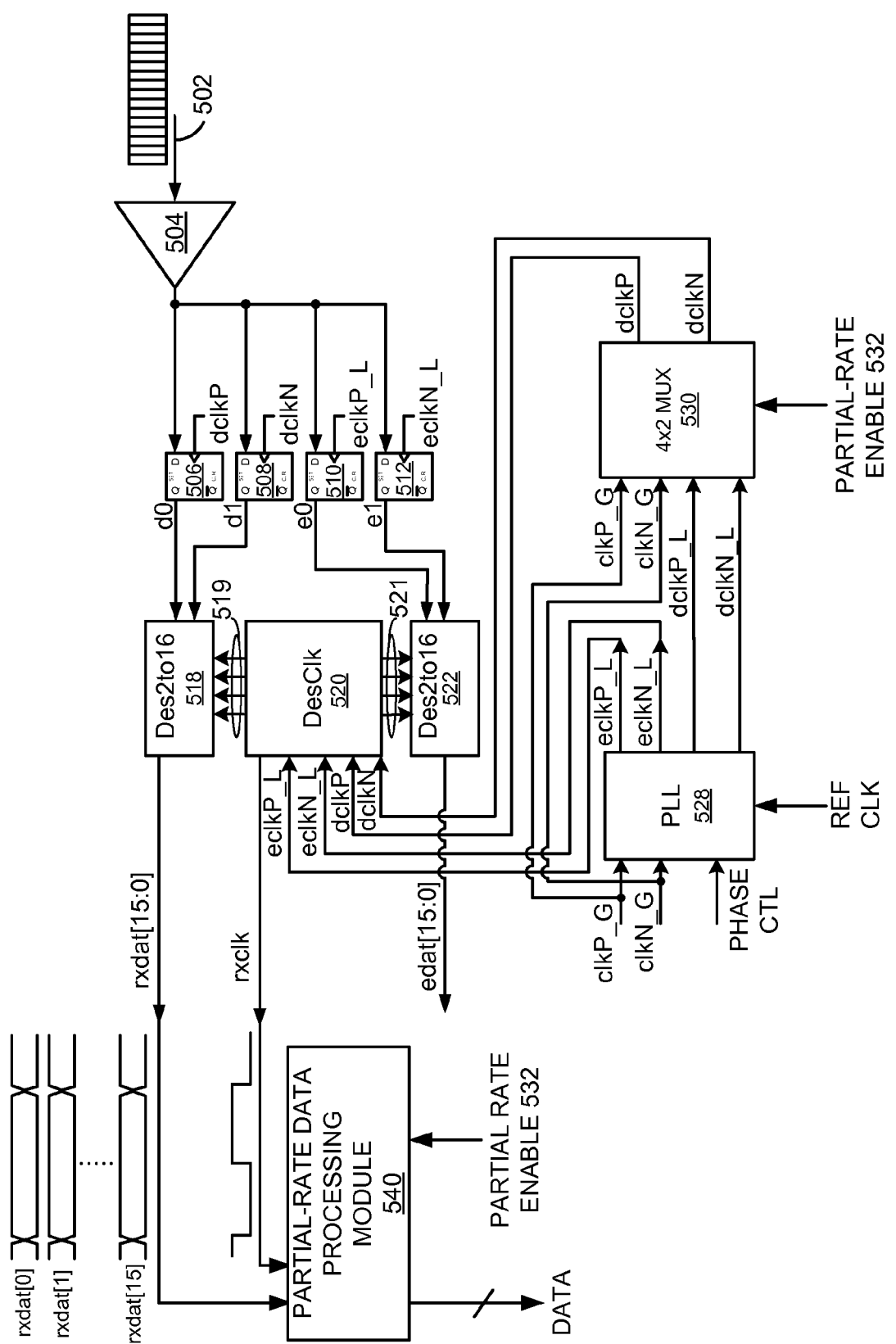
FIG. 5 presents an exemplary block diagram for a receiver capable of operating in a quarter-rate transfer mode in accordance with one embodiment of the present invention.

FIG. 5 presents an exemplary block diagram for a receiver capable of operating in a quarter-rate transfer mode in accordance with one embodiment of the present invention. A receiver system can include a receive port 502, an amplification circuit 504, a group of samplers 506, 508, 510, and 512, a deserializer-clock generation module (DesClk) 520, and two 2-to-16 deserializer 518 and 522. DesClk 520 provides two sets of clock signals 519 and 521 to deserializers 518 and 522, respectively. Also included in the receiver system are a phase-locking loop 528, a 4×2 multiplexer 530, and a partial-rate data processing module 540.

During the active mode, receive port 502 receives a data stream at the normal data rate. The received data stream is then amplified by amplification circuit 504, and is sampled by four samplers 506, 508, 510, and 512. In one embodiment, a respective sampler is a flip-flop triggered by a sampling edge. In this example, data samplers 506 and 508 are triggered by data sampling signals (dclkp, dclkN), which correspond to the sampling signals dclkP and dclkN in FIG. 3. Ideally, data sampling signals (dclkp, dclkN) are phase-adjusted to the data-eye midpoints of incoming data bits, and samplers 506 and 508 take samples at the center of two consecutive data eyes to produce two consecutive data bits, d0 and d1. Similarly, edge samplers 510 and 512 are triggered by edge sampling signals (eclkP_L, eclkN_L), which correspond to the sampling signals eclkP and eclkN in FIG. 3.

In one embodiment, PLL 528 generates phase-adjusted local clock signals, which include two local data clocks (dclkP_L, dclkN_L), and two local edge clocks (eclkP_L, eclkN_L). PLL 528 generates these local clock signals based on a pair of global clock signals (clkP_G, clkN_G), which correspond to the output of the phase-locking mechanism 204 in system 202 as illustrated in FIG. 2. Note that, during the active mode, PLL 528 may continuously adjust the phase of the four local clock signals based on a phase control signal, which can be derived from the relative phase information of the data and edge samples.

4×2 multiplexer 530, which is controlled by a partial-rate enable signal 532, selects between the global clock signals (clkP_G, clkN_G) and the local data clock signals (dclkP_L, dclkN_L). When partial-rate enable signal 532 is set, multiplexer 530 selects the global clock signals (clkP_G, clkN_G) as the data sampling signals (dclkp, dclkN), which are used to trigger flip-flops 506 and 508. During the active mode, partial-rate enable signal 532 is unset and multiplexer 530 selects the local data clock signals (dclkP_L, dclkN_L) as the data sampling signals (dclkp, dclkN).

The outputs of data samplers 506 and 508 are coupled to 2-to-16 deserializer 518. Virtually any circuit for reorganizing an incoming sequence of 2-bit values to an outgoing sequence of m-bit values (m=16 in this example) may be used to implement deserializer 518. For example, in one embodiment, deserializer 518 is based on a tree of 1:2 demultiplexers clocked by a set of divider-chain clock signals 519 (dclkp, dclkP/2, dclkP/4, dclkP/8), wherein dclkP/n denotes a clock signal the frequency of which is equal to the frequency of dclkP divided by n. DesClk 520 derives clock signals 519 based on dclkP and/or dclkN.

Note that in the active mode, DesClk 520 derives clock signals 519 based on the local data clock signals (dclkP_L, dclkN_L), which are the outputs of 4×2 multiplexer 530 when partial-rate enable signal 532 is unset (i.e., deasserted). In the partial-rate mode, DesClk 520 derives clock signals 519 based on the global clock signals (clkP_G, clkN_G), which are the outputs of 4×2 multiplexer 530 when the partial-rate enable signal 532 is set (i.e., asserted). In this example, the output of deserializer 518 is a 16-bit wide data stream, rxdat [15:0]. DesClk 520 also generates a receiver clock signal rxclk which can be used to sample the deserialized data rxdat [15:0].

DesClk 520 further generates a set of divider-chain clock signals 521 to clock deserializer 522, which converts the two edge bits e0 and e1 from edge samplers 510 and 512 into a 16-bit wide edge data stream edat[15:0].

In partial-rate mode, the operation of the edge samplers 510 and 512, and deserializer 522 are the same as in the active mode, since they are clocked by the same local edge clock signals (eclkP_L, eclkN_L). The data samplers 506 and 508, and deserializer 518 are clocked by the global clocks (clkP_G, clkN_G). Meanwhile, PLL 528 continuously adjusts the phase of (dclkP_L, dclkN_L) and (eclkP_L, eclkN_L) in preparation of the active mode. Although data samplers 506 and 508, deserializer 518, and part of DesClk 520 are shared between the partial-rate mode and active mode in this embodiment, it is also possible to provide a separate set of samplers in similar configuration for the partial-rate operation.

Note that in the partial-rate mode, each bit is transmitted four times in the data stream received at receive port 502. Hence, the deserialized data output rxdat[15:0] typically contains 3, 4, or 5 identical bits which are adjacent to each other, depending on the phase of global clocks (clkP_G, clkN_G) relative to the phase of the serial bits in the incoming data stream. For example, rxdat[2]-rxdat[5] can be identical and carry the same data bit which is transmitted four times. In other words, the 16-bit wide data output rxdat[15:0] only carries four bits of useful information. Therefore, partial-rate data processing module 540 selects four bits out of the 16 bits of rxdat[15:0] as the received data bits during the partial-rate mode. Note that partial-rate processing module 540 is controlled by partial-rate enable signal 532. In the active mode when partial-rate enable signal 532 is unset, partial-rate data processing module 540 allows the entire 16-bit-wide rxdat [15:0] to pass through as received data.

In one embodiment, the receiver system performs a calibration process before commencing payload data transfer. This calibration process allows the system to determine the amount of logical shift to apply to rxdat[15:0], so that the received words are aligned with the transmitted words. FIG. 6 illustrates an exemplary calibration process in a quarter-rate transfer mode in accordance with an embodiment of the present invention. During the calibration process, the transmitter typically transmits a unique pattern, which in this example is a 16-bit long stream "0000001111000000." Assume that the transmission channel introduces an arbitrary shift to the received stream. For illustration purposes, the received 16-bit wide parallel word rxdat[15:0] could be "0000000000011110."

The system then selects the second "1," which corresponds to position rxdat[3] and is indicated by a bold font, as the reference sampling point. The system further applies a logical five-bit left shift to rxdat[15:0] and generates a shifted 16-bit-wide word rxshift[15:0]. As a result, the received second "1" is at position rxshift[8] and is aligned with the position of the second "1" in the transmitted pattern. Note that, after the five-bit left shift, the system uses bit positions rxshift[14], rxshift[10], rxshift[6], and rxshift[2] as the four sampling points, since every 16-bit word contains four meaningful bits in the quarter-rate mode.

The example below is provided to illustrate how the five-bit left shift allows the system to align its received words with the transmitted words. Assume that the transmitter is to transmit a payload data stream "ABCDEFGH." The actual transmitted 16-bit words in the quarter-rate mode are "AAAABBBBC-CCCDDDD" and "EEEEFFFFGGGGHHHH," since every bit is transmitted four times. Before the five-bit shift, the received parallel words rxdat[15:0] are "00000AAAABBBBCCC," "CDDDDEEEEFFFFGGG," and "GHHHH00000000000." The system then applies a five-bit left shift to rxdat[15:0], which results in two words in rxshift[15:0]: "AAAABBBBCCCCDDDD" and "EEEEFFFFGGGGHHHH." Note that the system selects the second bit of every four-bit group, which is underlined, as the sampling point for each data bit. This calibration process allows the receiver system to recover the original word "ABCDEFGH."

The above calibration process allows a drift of up to six unit intervals in either direction (early or late) to be detected and compensated for with a shifter block which uses rxdat[15:0] as the input and produces rxshift[15:0] as the output. The bits in rxshift[15:0] that are shifted out are to be merged into the previous or next rxshift[15:0] word. Furthermore, the above calibration process can be performed by partial-rate data processing module 540.

FIG. 7 presents an exemplary block diagram for a transmitter capable of operating in a partial-rate transfer mode in accordance with one embodiment of the present invention. Transmitter 700 typically includes a 16-to-2 serializer 702, a serializer clock generator (SerClk) 720, a 2×1 multiplexer, and a transmission driver 604. During operation, transmitter 700 receives the payload data txdat[15:0] in parallel format. Serializer 702 converts the 16-bit-wide parallel data into two serial streams, d0 and d1. In one embodiment, serializer 702 includes a tree of 2×1 multiplexers and is clocked by a set of divider-chain clock signals generated by SerClk 720. 2×1 multiplexer 704, which is clocked by a pair of clocks (clkP, clkN), further multiplexes d0 and d1 in a DDR fashion. Transmission driver 604 then transmits the output of 2×1 multiplexer 704, which is a serial bit stream, onto a transmission medium.

During the partial-rate mode, each 16-bit-wide word txdat [15:0] contains four meaningful bits, wherein each meaningful bit is transmitted four times. For example, txdat[15:12], txdat[11:8], txdat[7:4], and txdat[3:0] each contains four identical bits.

Half-Rate Transfer Mode

In one embodiment, the transmitter system transmits each data bit consecutively twice during the partial-rate mode, thus effecting a half-rate transfer mode or half-rate mode, in which the effective data rate of the transfer is half of the full data rate. FIG. 8 presents an exemplary timing diagram of a data signal and a set of quadrature global clock signals used in a half-rate transfer mode in accordance with one embodiment of the present invention.

As illustrated in FIG. 8, a data bit is transmitted consecutively twice, over two unit intervals. Hence, the transmitter can emulate a transmission at half the full data rate. For example, intervals "AB" carry the value of one data bit, and intervals "CD" carry the value of another data bit. On the receiver side, the receiver uses a set of phase-locked (but not necessarily phase-adjusted) global quadrature clock signals as the data and edge sampling signals. These quadrature clock signals are separated by 90° in phase. For example, global clock signals dclkP_G and eclkP_G provide two rising edges 802 and 804, which can be used to sample twice the value at interval "A." Similarly, global clock signals dclkN_G and eclkN_G provide two rising edges 806 and 808, which can be used to sample twice the value at interval "B." Collectively, these four rising edges provide four consecutive samples during the time occupied by one data bit, which extends over two intervals. Note that in some embodiment the receiver system is only provided with a pair global clock signals (dclkP_G, dclkN_G). A quadrature clock-generation mechanism can be used to generate the complete set of quadrature clock signals by using, for example, delay-locking loops (DLLs).

The values detected by these four clock signals are denoted as "d0," "e0," "d1," and "e1," as illustrated in FIG. 8. The value of d0 corresponds to the values of intervals A, C, E, G, and so forth. The value of e0 corresponds to the values detected substantially between intervals A and B, C and D, E and F, G and H, and so forth. The value of d1 corresponds to the values of intervals B, D, F, H, and so forth. The value of e1 corresponds to the values detected substantially between intervals B and C, D and E, F and G, and so forth.

In general, during the half-rate mode, the receiver system samples four times a data bit which extends over two intervals with the four global clock signals (dclkP_G, dclkN_G, eclkP_G, eclkN_G). These four samples, when interleaved, provide four consecutive samples of a data bit. Note that the system does not need to adjust the phase of these sampling signals, since at least one sampling edge would fall substantially in the middle of a two-interval-long data bit.

Typically, every data bit is sampled four times by the quadrature global clocks, and the system can select the second or third sample as the main sampling point for a data bit. In the most extreme scenario, five or three sampling edges may fall within the same data bit due to signal drift or jitter. In such cases, the system can select the sampling edge in the middle (e.g., the second sampling edge if three sampling edges fall within one data bit, or the third sampling edge if five sampling edges fall within one data bit) as the main sampling point. This way, the system can ensure the best signal-detection margin both before and after that sampling point. Further details of the calibration process and how to select the sampling point are provided in the description in conjunction with FIG. 10.

FIG. 9 presents an exemplary block diagram of a receiver capable of operating in a half-rate transfer mode in accordance with one embodiment of the present invention. A receiver system can include a receive port 902, an amplification circuit 504, a group of samplers 906, 908, 910, and 912, a deserializer-clock generation module (DesClk) 920, and two 2-to-16 deserializers 918 and 922. DesClk 920 provides two sets of clock signals 919 and 921 to deserializers 918 and 922, respectively. Also included in the receiver system are a phase-locking loop 928, an 8×4 multiplexer 930, and a partial-rate data processing module 940.

During the active mode, receive port 902 receives a data stream at the normal data rate. The received data stream is then amplified by amplification circuit 904, and is sampled by four samplers 906, 908, 910, and 912. In one embodiment, a respective sampler is a flip-flop triggered by a sampling edge. In this example, data samplers 906 and 908 are triggered by data sampling signals (dclkp, dclkN), which correspond to the sampling signals dclkP and dclkN in FIG. 3. Ideally, data sampling signals (dclkp, dclkN) are phase-adjusted to the data-eye midpoints of incoming data bits, and samplers 906 and 908 take samples at the center of two consecutive data eyes to produce two consecutive data bits, d0 and d1. Similarly, edge samplers 910 and 912 are triggered by edge sampling signals (eclkp, eclkN), which correspond to the sampling signals eclkP and eclkN in FIG. 3. Ideally, edge sampling signals (eclkp, eclkN) are phase-adjusted to the incoming data bits, and samplers 910 and 912 take samples at the transition edges between two consecutive data bits.

In one embodiment, PLL 928 generates phase-adjusted local clock signals, which include the two local data clocks (dclkP_L, dclkN_L), and two local edge clocks (eclkP_L, eclkN_L). PLL 928 generates these local clock signals based on a pair of global clock signals (clkP_G, clkN_G), which correspond to the output of the phase-locking mechanism 204 in system 202 as illustrated in FIG. 2. Note that, during the active mode, PLL 928 may continuously adjust the phase of these four local clock signals based on a phase control signal, which can be derived from the relative phase information of the data and edge samples.

8×4 multiplexer 530, which is controlled by a partial-rate enable signal 932, selects between the global clock signals (dclkP_G, dclkN_G, eclkP_G, eclkN_G) and the local clock signals (dclkP_L, dclkN_L, eclkP_L, eclkN_L). When partial-rate enable signal 932 is set, multiplexer 930 selects the global clock signals (dclkP_G, dclkN_G, eclkP_G, eclkN_G) as the data and edge sampling signals for samplers 906, 908, 910, and 912. During the active mode, partial-rate enable signal 932 is unset, and multiplexer 930 selects the local clock signals (dclkP_L, dclkN_L, eclkP_L, eclkN_L) as the sampling signals.

Note that the global clock signals (clkP_G, clkN_G) are used as the data sampling signals during the partial-rate mode. A pair of corresponding global edge clock signals (eclkP_G, eclkN_G) are used for edge detection by samplers 910 and 912. Global edge clock signals (eclkP_G, eclkN_G) can be locally generated based on (clkP_G, clkN_G) with, for example, a DLL or an equivalent phase-shifting circuit with zero standby power consumption and a quick turn-on time in the partial-rate mode.

The outputs of data samplers 906 and 908 are coupled to 2-to-16 deserializer 918. Virtually any circuit for reorganizing an incoming sequence of 2 bit values to an outgoing sequence of m-bit values (m=16 in this example) may be used to implement deserializer 918. For example, in one embodiment, deserializer 918 is based on a tree of 1:2 demultiplexers clocked by a set of divider-chain clock signals 919 (dclkp, dclkP/2, dclkP/4, dclkP/8), wherein dclkP/n denotes a clock signal the frequency of which is equal to the frequency of dclkP divided by n. DesClk 920 derives clock signals 919 based on dclkP and/or dclkN.

Note that in the active mode, DesClk 920 derives clock signals 919 based on the local clock signals (dclkP_L, dclkN_L, eclkP_L, eclkN_L), which are the outputs of 8×4 multiplexer 930 when partial-rate enable signal 932 is unset (i.e., deasserted). In the partial-rate mode, DesClk 920 derives clock signals 919 based on the global clock signals (dclkP_G, dclkN_G, eclkP_G, eclkN_G), which are the outputs of 8×4 multiplexer 930 when the partial-rate enable signal 932 is set (i.e., asserted). In this example, the output of deserializer 918 is a 16-bit wide data stream, rxdat[15:0]. DesClk 920 also generates a receiver clock signal rxclk which can be used to sample the deserialized data rxdat[15:0].

DesClk 920 further generates a set of divider-chain clock signals 921 to clock deserializer 922, which converts the two edge bits e0 and e1 from edge samplers 910 and 912 into a 16-bit wide edge data stream edat[15:0]. Note that, in partial-rate mode, the system uses both rxdat[15:0] and edat[15:0] to determine a reliable sampling point for a data bit which extends over two unit intervals.

In the embodiment illustrated in FIG. 9, the samplers 906, 908, 910, and 912, data deserializer 918, edge deserializer 922, and DesClk 920 are shared between the active mode and partial-rate mode. It is also possible to provide a separate set of samplers in similar configuration for the partial-rate operation.

Note that in the partial-rate mode, each bit is transmitted twice in the data stream received at receive port 902. Hence, the deserialized data output rxdat[15:0] typically contains 1, 2, or 3 identical bits which are adjacent to each other, depending on the phase of global clocks (clkP_G, clkN_G) relative to the phase of the serial bits in the incoming data stream. For example, rxdat[2]-rxdat[3] can be identical and carry the same data bit which is transmitted twice. Similarly, edat[15:0] can contain 1, 2, or 3 identical bits which correspond to the same duplicated data bit. In other words, the 16-bit wide data output rxdat[15:0] and edge output edat[15:0] only carry eight bits of useful information. Therefore, partial-rate data processing module 940 selects four bits out of the 32 bits of rxdat[15:0] and edat[15:0] as the received data bits during the partial-rate mode. Note that partial-rate processing module 940 is controlled by partial-rate enable signal 932. In the active mode when partial-rate enable signal 932 is unset, partial-rate data processing module 940 allows the entire 16-bit-wide rxdat[15:0] to pass through as received data.

In one embodiment, the receiver system performs a calibration process before commencing payload data transfer. This calibration process allows the system to determine the amount of logical shift to apply to rxdat[15:0] or edat[15:0], so that the received words are aligned with the transmitted words. FIG. 10 illustrates an exemplary calibration process in a quarter-rate transfer mode in accordance with an embodiment of the present invention. During the calibration process, the transmitter typically transmits a unique pattern, which in this example is a 16-bit long stream "0000000110000000." Assume that the transmission channel introduces an arbitrary shift to the received stream. For illustration purposes, the received 16-bit wide parallel word rxdat[15:0] could be "0000110000000000," and edat[15:0] could be "0001100000000000."

The system then interleaves rxdat[15:0] and edat[15:0], and determines to use the second "1" in edat[15:0], which is at position edat[11], as the sampling point, since it is the third sample in the four continuous samples of "1." The system further applies a logical four-bit right shift to edat[15:0] and generates a shifted 16-bit-wide word rxshift[15:0]. As a result, the received second "1" is at position rxshift[7] and is aligned with the position of the second "1" in the transmitted pattern. After the four-bit right shift, the system uses bit positions rxshift[15], rxshift [13], rxshift[11], rxshift[9], rxshift[7], rxshift[5], rxshift[3], and rxshift[1] as the eight sampling points, since every 16-bit word contains eight meaningful bits in the half-rate mode.

The example below is provided to illustrate how the four-bit right shift allows the system to align its received words with the transmitted words. Assume that the transmitter is to transmit a payload data stream "ABCDEFGH." The actual transmitted 16-bit word in the half-rate mode is "AABBCCDDEEFFGGHH," since every bit is transmitted twice. Before the four-bit right shift, the received parallel words edat[15:0] are "000000000000AABB" and "CCDDEEFFGHH0000." The system then applies a four-bit right shift to edat[15:0], which results in one word in rxshift[15:0]: "AABBCCDDEEFFGGHH." Note that the system selects the first bit of every two-bit group, which is underlined, as the sampling point for each data bit. This calibration process allows the receiver system to recover the original word "ABCDEFGH."

The above calibration process allows a drift of up to eight bit times in either direction (early or late) to be detected and compensated for with a shifter block which uses rxdat[15:0] or edat[15:0] as the input and produces rxshift[15:0] as the output. The bits in rxshift[15:0] that are shifted out are to be merged into the previous or next rxshift[15:0] word. Furthermore, the above calibration process can be performed by partial-rate data processing module 940.

Partial-Rate Operation with Multiplicated Global Clock Signals

Figure 11:
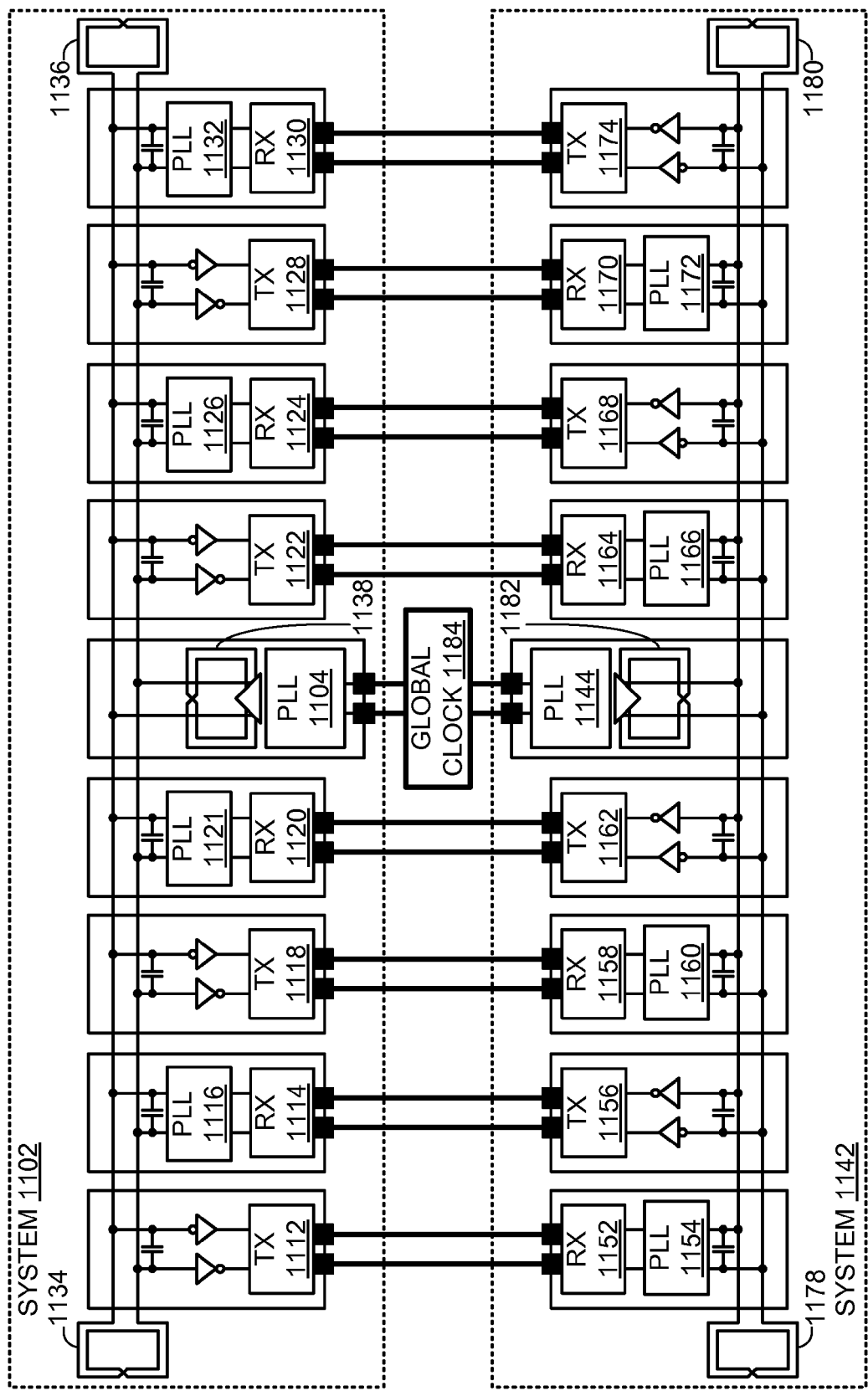
FIG. 11 illustrates a number of transmitter-receiver pairs with a resonant clock-distribution network capable of operating in a partial-rate transfer mode in accordance with one embodiment of the present invention.

Embodiments of the present invention can be used in transmitter or receiver systems with multiplicated global clock signals. FIG. 11 illustrates a number of transmitter-receiver pairs with a resonant clock-distribution network capable of operating in a partial-rate transfer mode in accordance with one embodiment of the present invention. A global clock-distribution mechanism 1184 distributes a low-frequency global clock signal to both systems 1102 and 1142. System 1102 includes a phase-locking and frequency-multiplication mechanism 1104, a set of inductors 1138, 1134, and 1136, transmitters 1112, 1118, 1122, and 1128, receivers 1114, 1120, 1124, and 1130, and local, receiver-specific phase-adjusting mechanisms 1116, 1121, 1126, and 1132. Similarly, system 1142 includes a phase-locking and frequency-multiplication mechanism 1144, a set of inductors 1182, 1178, and 1180, transmitters 1156, 1162, 1168, and 1174, receivers 1152, 1158, 1164, and 1174, and local, receiver-specific phase-adjusting mechanisms 1154, 1160, 1166, and 1172. The transmitters in system 1102 are coupled to the receivers in system 1142, and vice versa.

Since the configurations of system 1142 is substantially similar to that of system 1102, the following description is directed to system 1102 and applies also to system 1142. During operation, global clock-distribution mechanism 1184 delivers a low-frequency clock signal to system 1102. This low-frequency clock signal is received by phase-locking and frequency-multiplication mechanism 1104. In one embodiment, phase-locking and frequency-multiplication mechanism 1104 includes a PLL with frequency-multiplication capability. For example, PLL 1104 can be configured to lock into a frequency that is eight times the frequency of the received global signal. If the low-frequency global clock signal is at 400 MHz, the output of PLL 1104 can be at 3.2 GHz.

The output of PLL 1104 is then distributed to the transmitters and receivers through a resonant clock-distribution network, which includes inductors 1134, 1136, and 1138. The inductance of these three inductors are chosen to match with the inherent impedance of the clock-distribution network, so that the entire clock-distribution network exhibits a resonant frequency that is substantially the same as the frequency of the output of PLL 1104. This way, system 1104 can transmit and receive data at a much higher data rate while the global clock distribution mechanism 1102 can operate at a low frequency.

Systems 1102 can operate in three modes: standby, partial-rate, and active. In the standby mode, transmitters 1112, 1118, 1122, and 1128, receivers 1114, 1120, 1124, and 1130, and local receiver-specific phase-adjusting mechanisms 1116, 1121, 1126, and 1132 are turned off. However, clock-multiplication PLL 1104 remains operational, and the multiplied global clock signal is continuously distributed through the resonant clock-distribution network in system 1102.

In the partial-rate mode, the transmitters, receivers, and local receiver-specific phase-adjusting mechanism are turned on. The transmitters and receivers operate at a partial data rate, as described previously in conjunction with FIG. 5 and FIG. 10. Meanwhile, each local receiver-specific phase-adjusting mechanism adjusts the phase of a set of quadrature clock signals in preparation for the active-mode data transfer which is at the full data rate.

After the local, receiver-specific phase-adjusting mechanisms have locked the local quadrature clock signals into the optimal phase, system 1102 enters the active mode and begins data transfer at the full data rate.

The partial-rate mode is particularly useful for system 1102, because the global clock signal has a fixed frequency. In system 1102, it is difficult to obtain a slower clock for power-saving purposes, because the intra-system clock distribution system is tuned to a particular frequency. By transferring data at a partial data rate, system 1102 can reduce the inter-mode switching overhead and reduce data-transfer latency.

Although the partial-rate operation is described in the context of DDR communication channels, the partial-rate data transfer mechanism can also be used for single data-rate (SDR) communication channels where a period of the clock signal corresponds to one unit interval.

The components of the partial-rate data transfer mechanism described above can include any collection of computing components and devices operating together. The components of the partial-rate data transfer mechanism can also be components or subsystems in a larger computer system or network. Components of a partial-rate data transfer mechanism can also be coupled among any number of components (not shown), for example, buses, controllers, memory devices, and data input/output (I/O) devices, in any number of combinations. Many of these system components may be situated on a common printed circuit board or integrated circuit, or may be integrated in a system that includes several printed circuit boards or ICs that are coupled together in a system, for example, using connector and socket interfaces such as those employed by personal computer motherboards and dual inline memory modules ("DIMM"). In other examples, complete systems may be integrated in a single package housing using a system in package ("SIP") type of approach. Integrated circuit devices may be stacked on top of one another and utilize wire bond connections to effectuate communication between devices or may be integrated on a single planar substrate in the package housing.

Further, functions of the partial-rate data transfer mechanism can be distributed among any number/combination of other processor-based components. The partial-rate data transfer mechanism described above can include, for example, various DRAM systems. As examples, the DRAM memory systems can include DDR systems like DDR SDRAM, as well as DDR2 SDRAM, DDR3 SDRAM, and other DDR SDRAM variants, such as Graphics DDR ("GDDR") and further generations of these memory technologies, including GDDR2 and GDDR3, but are not limited to these memory systems.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

Aspects of the partial-rate data transfer mechanisms described herein may be implemented as functionality programmed into any of a variety of circuitry, including programmable logic devices (PLDs), such as field programmable gate arrays (FPGAs), programmable array logic (PAL) devices, electrically programmable logic and memory devices, and standard cell-based devices, as well as application specific integrated circuits (ASICs). Some other possibilities for implementing aspects of the partial-rate data transfer mechanisms include: microcontrollers with memory (such as electronically erasable programmable read only memory (EEPROM), embedded microprocessors, firmware, software, etc.). Furthermore, aspects of the partial-rate data transfer mechanisms may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A system, comprising:
   clock-receiving circuitry to receive a global clock signal;
   phase-adjusting circuitry to adjust a phase of a first clock signal; and
   data-receiving circuitry to operate in one of at least a partial-rate mode and a full-rate mode;
   wherein in the partial-rate mode,
      a data bit is transmitted in at least two intervals, wherein a respective interval corresponds to a transmission time of one data bit in the full-rate mode; and
      the data-receiving circuitry receives the data bit based on the global clock signal; and
   wherein in the full-rate mode,
      a data bit occupies one interval; and
      the data-receiving circuitry receives the data bit based on a phase-adjusted local clock signal of which the frequency is substantially similar to that of the global clock signal and of which the phase is adjusted with respect to the data bits by the phase-adjusting circuitry.

2. The system of claim 1,
   wherein in the partial-rate mode, the data-receiving circuitry samples the data bit using the global clock signal and a complement of the first clock signal.

3. The system of claim 1, further comprising calibration circuitry, wherein in the partial-rate mode, the calibration circuitry is configured to:
   select a sampling point for a received data bit; and
   shift the received bit so that the received bit is aligned with a corresponding transmitted bit.

4. The system of claim 1,
   wherein in the partial-rate mode, the data bit is transmitted in two consecutive intervals; and
   wherein the system further comprises quadrature clock generation circuitry to generate a set of quadrature clock signals separated by approximately 90° based on the global clock signal.

5. The system of claim 1,
   wherein in the partial-rate mode, the phase-adjusting circuitry adjusts the phase of the global clock signal to produce the local clock signal; and
   wherein the local clock signal is adjusted to a substantially optimal sampling point for a respective data bit.

6. The system of claim 1,
   wherein the data-receiving circuitry comprises a deserializer which is shared in both partial-rate and full-rate modes.

7. The system of claim 1,
   wherein the system is allowed to enter a standby mode in which the data-receiving circuitry and the phase-adjusting circuitry are substantially turned off.

8. The system of claim 1,
   wherein the global clock signal has a substantially stable frequency and phase.

9. The system of claim 1, further comprising phase-locking circuitry to produce the global clock signal based on a globally distributed clock signal.

10. The system of claim 9,
wherein the phase-locking circuitry is configured to multiply the frequency of the globally distributed clock signal; and
wherein the system further comprises a resonant clock-distribution network with a resonance frequency substantially equal to the frequency of the global clock signal produced by the phase-locking circuitry.

11. The system of claim 10,
wherein the resonant clock-distribution network comprises at least one inductor.

12. The system of claim 1,
wherein a period of the global clock signal corresponds to one or two intervals.

13. A system, comprising:
a clock-signal path to carry a clock signal;
a data-signal path to carry a data signal; and
transmission circuitry coupled to the clock-signal path and the data-signal path to transmit data bits in one of at least a partial-rate mode and a full-rate mode;
wherein in the partial-rate mode, the transmission circuitry transmits a respective data bit repeatedly in at least two consecutive intervals, wherein a respective interval corresponds to a transmission time of one data bit in the full-rate mode; and
wherein in the full-rate mode, the transmission circuitry transmits a respective data bit in one interval.

14. The system of claim 13,
wherein the clock signal has a substantially stable frequency and phase.

15. The system of claim 13, further comprising phase-locking circuitry to produce the clock signal based on a globally distributed clock signal.

16. The system of claim 15,
wherein the phase-locking circuitry is configured to multiply the frequency of the globally distributed clock signal; and
wherein the system further comprises a resonant clock-distribution network, which is coupled to the phase-locking circuitry and the clock-signal path, and which has a resonance frequency substantially equal to the frequency of the clock signal produced by the phase-locking circuitry.

17. The system of claim 16,
wherein the resonant clock-distribution network comprises at least one inductor.

18. The system of claim 13,
wherein a period of the clock signal corresponds to one or two intervals.

19. A memory module, comprising:
clock-receiving circuitry to receive a global clock signal;
phase-adjusting circuitry coupled to the clock-receiving circuitry; and
data-receiving circuitry to operate in a standby mode, a partial-rate mode, or an active mode;
wherein in the standby mode, power supplied to the data-receiving circuitry and the phase-adjusting circuitry is substantially removed;
wherein in the partial-rate mode, the data-receiving circuitry receives a data bit transmitted repeatedly over more than one interval based on the global clock signal, wherein a respective interval corresponds to a transmission time of a data bit in the active mode, and the phase-adjusting circuitry adjusts the phase of the global clock signal based on received data to produce a local phase-adjusted clock signal; and
wherein in the active mode, the data-receiving circuitry receives a data bit transmitted in one interval based on the local phase-adjusted clock signal.

20. A memory controller, comprising:
a clock-signal path to convey a global clock signal;
phase-adjusting circuitry coupled to the clock-signal path; and
data-receiving circuitry to operate in a standby mode, a partial-rate mode, or an active mode;
wherein in the standby mode, power supplied to the data-receiving circuitry and the phase-adjusting circuitry is substantially removed;
wherein in the partial-rate mode, the data-receiving circuitry receives a data bit transmitted repeatedly over more than one interval based on the global clock signal, wherein a respective interval corresponds to a transmission time of one data bit, and the phase-adjusting circuitry adjusts the phase of the global clock signal based on received data to produce a local phase-adjusted clock signal; and
wherein in the active mode, the data-receiving circuitry receives a data bit transmitted in one interval based on the second phase-adjusted clock signal.

21. A method, comprising:
receiving a global clock signal with a substantially stable frequency and phase;
in a partial-rate mode, while producing a phase-adjusted local clock signal with respect to the data bits, receiving data bits, each of which is transmitted repeatedly over at least two consecutive intervals based on the global clock signal, wherein a respective interval corresponds to a transmission time of one data bit in an active mode; and
in a subsequent active mode, receiving data bits, each of which is transmitted once in an interval based on the local clock signal of which the phase is adjusted to a substantially optimal sampling point for each data bit.

22. The method of claim 21,
wherein in the partial-rate mode, the method further comprises calibrating data detection by selecting a sample that is substantially in the middle of a group of samples corresponding to a number of repeated data bit as a periodic sampling point.

* * * * *